United States Patent [19]

Norton et al.

[11] Patent Number: 4,943,491
[45] Date of Patent: Jul. 24, 1990

[54] STRUCTURE FOR IMPROVING INTERCONNECT RELIABILITY OF FOCAL PLANE ARRAYS

[75] Inventors: Peter W. Norton, Littleton; James A. Stobie, Westford; Peter H. Zimmermann, Lexington, all of Mass.

[73] Assignee: Honeywell Inc., Minneapolis, Minn.

[21] Appl. No.: 438,241

[22] Filed: Nov. 20, 1989

[51] Int. Cl.⁵ .......................... H01L 27/14; G01J 1/00
[52] U.S. Cl. ...................................... 428/620; 250/332; 250/338.4; 250/370.08
[58] Field of Search ............... 428/620, 641, 674, 642, 428/616, 624, 618, 626; 250/332, 349, 370.08, 338.4

[56] References Cited

U.S. PATENT DOCUMENTS

| | | | |
|---|---|---|---|
| 3,808,435 | 4/1974 | Bale et al. | 250/332 |
| 4,039,833 | 8/1977 | Thom | 250/332 |
| 4,064,533 | 12/1977 | Lampe et al. | 250/332 |
| 4,067,104 | 1/1978 | Tracy | 437/183 |
| 4,228,365 | 10/1980 | Gutierrez et al. | 437/53 |
| 4,379,232 | 4/1983 | Hopper | 250/332 |
| 4,536,658 | 8/1985 | Ludington | 250/332 |
| 4,740,700 | 4/1988 | Shuham et al. | 250/344 |
| 4,757,210 | 7/1988 | Bharat et al. | 357/30 H |
| 4,783,584 | 11/1988 | Schulte et al. | 250/370.08 |
| 4,792,672 | 12/1988 | Schmitz | 250/211 R |
| 4,868,902 | 9/1989 | Sato | 330/9 |

Primary Examiner—John J. Zimmerman
Attorney, Agent, or Firm—Haugen and Nikolai

[57] ABSTRACT

An improved structure for interconnecting focal plane arrays. A first body having a first coefficient of expansion comprising a detector array is connected by interconnection apparatus to a second body having a second coefficient of expansion. The second body comprises semiconductor electronics and includes a bottom surface which opposes the surface connected to the first body. A layer of material is bonded with an adhesive to the second body's bottom surface wherein the bonded layer has a third coefficient of expansion which is greater than the first and second coefficients of expansion. In one aspect of the invention, the interconnection apparatus comprises interconnect columns made substantially of indium, the second body is substantially comprised of silicon and the first body is substantially comprised of material selected from the group consisting of CdTe and HgCdTe. The bonded layer may advantageously be substantially comprised of copper.

19 Claims, 1 Drawing Sheet

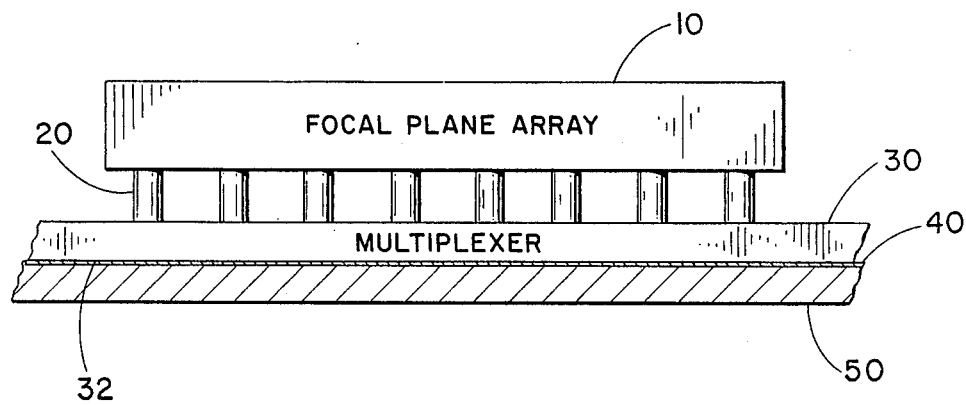

STRUCTURE FOR IMPROVING INTERCONNECT RELIABILITY OF FOCAL PLANE ARRAYS

BACKGROUND OF THE INVENTION

This invention is directed generally to apparatus for electrically interconnecting electrical elements, and, more particularly, to an improved structure for use in connecting focal plane array components to each other as used in electromagnetic sensing devices, such as infrared sensing devices.

DISCUSSION OF THE PRIOR ART

Bump bonding has been used for a number of years for joining infrared detector array pixels to associated electronics such as multiplexer circuits. Such interconnection bumps provide both electrical, thermal and mechanical interconnects in hybrid Focal Plane Arrays (FPAs) at room temperature as well as at cryogenic temperatures. The detector pixels are typically comprised of material sensitive to receiving electromagnetic radiation, such as infrared radiation. Materials commonly employed are mercury cadmium telluride (HgCdTe) and cadmium telluride (CdTe). The associated multiplexer electronics are usually embedded in CMOS packaging comprised typically of silicon (Si). FPAs usually employ solid metal bumps as, for example, indium bumps for achieving a cold weld interconnection between the multiplexer electronics and the infrared detector pixels. Examples of such focal planes include PV HgCdTe-Si, PV InSb-Si, PtSi-Si, and extrinsic Si-Si focal planes. Prior art configurations typically use opposing bumps of the same shape, material and cross-section. For optimum bump-bonding integrity, the opposing bumps are aligned for maximum overlap.

The manufacturing of focal plane arrays requires bonding focal plane arrays made of CdTe or HgCdTe to associated electronics such as multiplexer electronics. The focal plane arrays are typically manufactured in room temperature environments. However, such arrays are typically operated under cryogenic temperatures. As a result, the reliability of the current interconnect technology is less than optimum because the metal column interconnects take all of the stress induced by differences in thermal expansion and contraction which exist between the detector array and the readout multiplexer electronics. Specifically, the detector array being comprised of a compound semiconductor will have a higher coefficient of expansion than the readout multiplexer which is usually comprised of a semiconductor material such as silicon.

The present invention overcomes the perceived disadvantages of the prior art by laminating a layer of material having a high coefficient of expansion to the body bearing the readout electronics. The laminated material has thermal expansion and contraction properties selected to force the semiconductor material to follow and match the expansion and contraction of the detector array. In this way, the semiconductor substrate is forced to follow the detector array thermal expansion and contraction, thus reducing stress on the interconnect columns. Since the mechanical stress on the interconnects between the detector array and the semiconductor body is reduced, the reliability of the metallic interconnects is improved.

SUMMARY OF THE INVENTION

The invention provides an improved structure for interconnecting focal plane arrays. A first body having a first coefficient of expansion comprising a detector array is connected by interconnection means to a second body having a second coefficient of expansion. The second body comprises semiconductor electronics and includes a bottom surface which opposes the surface connected to the first body. A layer of material is bonded with an adhesive to the second body's bottom surface wherein the bonded layer has a third coefficient of expansion which is greater than the first and second coefficients of expansion. Alternatively, the second body is grown epitaxially on the third body, in which case no adhesive is required.

In one aspect of the invention, the interconnection means comprises interconnect columns made substantially of indium, the second body is comprised of material selected from the group consisting of silicon and sapphire and the first body is substantially comprised of material selected from the group consisting of CdTe and HgCdTe.

It is one object of the invention to provide an improved structure for interconnecting focal plane arrays wherein the reliability of the indium column interconnects are improved by forcing a silicon multiplexer assembly to follow thermal expansion and contraction of the detector array assembly by laminating highly thermal expansive material to the silicon multiplexer electronics.

It is yet another object of the invention to reduce mechanical stress on indium interconnects used in manufacturing focal plane arrays between the detector array and the multiplexer, thereby improving the reliability of the indium interconnects.

Other objects, features and advantages of the invention will be recognized by those skilled in the art through the description of the preferred embodiment, claims, and drawings herein, wherein like numerals refer to like elements.

BRIEF DESCRIPTION OF THE DRAWINGS

The sole FIGURE schematically illustrates one embodiment of the structure of the invention.

DESCRIPTION OF THE PREFERRED EMBODIMENT

Referring now to the sole FIGURE, the improved interconnection structure of the invention is illustrated. Those skilled in the art will appreciate that the embodiment shown in the FIGURE is intended to highlight the principal features of the invention and is not intended to so limit the invention. The interconnection structure includes a first body 10, a second body 30, means for interconnecting the first and second bodies 20, an adhesive layer 40, and a third body layer 50, having a large expansion coefficient. The first body typically comprises a focal plane array which is made from materials substantially comprised of CdTe, HgCdTe or other materials used for radiation detection. The interconnect columns 20 are mounted by conventional means to the focal plane array in order to provide interconnections to associated electronics located on the second body 30. The interconnect columns are typically made substantially of indium. The second body is typically silicon but may also be comprised substantially of other semiconductor materials as are typically used in manufacturing large scale or very large scale integrated circuits.

Layer 50 is advantageously comprised of copper or a similar material and may be bonded to the bottom surface of the second body 30 by means of an adhesive layer 40 according to bonding techniques well known in the art. Adhesive layer 40 may be any well-known adhesive Epotek Brand epoxy or glue. Layer 50 is selected to have a coefficient of expansion which is greater than both the coefficients of expansion for the first and second bodies. Typically, the material chosen as layer 50 will advantageously have a coefficient of expansion at least twice as great as the coefficient of expansion of silicon as the case may be.

In another aspect of the invention, the second body may be epitaxially grown or otherwise deposited on the third body. In such cases, it is not necessary to employ an adhesive to join the second body to the third body.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. An improved structure for interconnecting focal plane arrays comprising:
   (a) a first body having a first coefficient of thermal expansion comprising a detector array;
   (b) a second body having a second coefficient of thermal expansion comprising semiconductor electronics having a bottom surface;
   (c) means for interconnecting the first and second bodies; and
   (d) a layer of material bonded with adhesive to the second body's bottom surface wherein the bonded layer has a third coefficient of thermal expansion greater than the first and second coefficients of thermal expansion.

2. The structure of claim 1 wherein the first body is substantially comprised of material selected from the group consisting of CdTe and HgCdTe.

3. The structure of claim 2 wherein the second body is substantially comprised of Si.

4. The structure of claim 3 wherein the bonded layer is an alloyed metal.

5. The structure of claim 4 wherein the bonded layer is substantially comprised of Cu.

6. The structure of claim 1 wherein the bonded layer is an alloyed metal.

7. The structure of claim 1 wherein the bonded layer is substantially comprised of Cu.

8. The structure of claim 1 wherein the second body comprises a readout multiplexer.

9. The structure of claim 8 wherein the second body is substantially comprised of Si.

10. The structure of claim 1 wherein the interconnection means comprises a plurality of metal column interconnects.

11. The structure of claim 10 wherein the metal column interconnects are substantially comprised of indium.

12. An improved structure for interconnecting infrared focal plane arrays comprising:
    (a) a first body having a first coefficient of expansion including a detector array which is substantially comprised of material selected from the group consisting of CdTe and HgCdTe;
    (b) a second body having a second coefficient of expansion including multiplexer electronics substantially comprised of material selected from the group consisting of Si and sapphire, wherein the second body includes a bottom surface;
    (c) a plurality of indium column interconnects wherein the interconnects bond the first and second bodies; and
    (d) a layer bonded with adhesive to the second body's bottom surface, and wherein the layer has a third coefficient of thermal expansion at least twice as great as the first and second coefficients of expansion.

13. An improved structure for interconnecting focal plane arrays comprising:
    (a) a first body having a first coefficient of thermal expansion including a detector array;
    (b) a second body having a second coefficient of expansion substantially equal to the first coefficient of expansion;
    (c) a third body which is epitaxially grown on the second body and whereon multiplexer electronics are fabricated; and
    (d) means for interconnecting the multiplexer electronics and the detector array.

14. The structure of claim 13 wherein the first body is substantially comprised of material selected from the group consisting of CdTe and HgCdTe.

15. The structure of claim 14 wherein the third body is substantially comprised of Si.

16. The structure of claim 15 wherein the second body is an alloyed metal.

17. The structure of claim 16 wherein the second body is substantially comprised of Cu.

18. The structure of claim 13 wherein the second body is an alloyed metal.

19. The structure of claim 13 wherein the second body is substantially comprised of Cu.

* * * * *